(12) United States Patent
Sreenivasan et al.

(10) Patent No.: US 11,526,191 B2
(45) Date of Patent: Dec. 13, 2022

(54) PRECISION REFERENCE CIRCUIT (71) Applicant: Texas Instruments Incorporated, Dallas, TX (US)

(72) Inventors: Sreejish Sreenivasan, Dallas, TX (US); Mehedi Hassan, Plano, TX (US); Tianhong Yang, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 169 days.

(21) Appl. No.: 16/781,549

(22) Filed: Feb. 4, 2020

(65) Prior Publication Data
US 2021/0240213 A1 Aug. 5, 2021

(51) Int. Cl.
*G05F 3/30* (2006.01)
*H03M 1/10* (2006.01)
*G05F 3/26* (2006.01)
*G05F 1/46* (2006.01)

(52) U.S. Cl.
CPC ............... *G05F 3/30* (2013.01); *G05F 3/26* (2013.01); *H03M 1/1019* (2013.01); *G05F 1/46* (2013.01); *G05F 3/267* (2013.01)

(58) Field of Classification Search
CPC . G05F 1/46; G05F 1/462; G05F 1/567; G05F 3/22; G05F 3/24; G05F 3/242; G05F 3/245; G05F 3/26; G05F 3/262; G05F 3/267; G05F 3/30; H02M 1/1019
See application file for complete search history.

(56) References Cited

U.S. PATENT DOCUMENTS

| | | | | |
|---|---|---|---|---|
| 6,222,470 | B1* | 4/2001 | Schuelke | G05F 3/30 327/513 |
| 9,564,805 | B2* | 2/2017 | Sano | H02M 3/158 |
| 10,386,879 | B2* | 8/2019 | Yen | G05F 3/08 |
| 2006/0061412 | A1* | 3/2006 | Molina | G05F 3/30 327/539 |
| 2012/0081099 | A1* | 4/2012 | Melanson | G05F 3/30 323/313 |
| 2016/0004269 | A1* | 1/2016 | Ivanov | G05F 3/20 327/321 |
| 2016/0266598 | A1* | 9/2016 | Wong | G05F 3/267 |
| 2019/0171241 | A1* | 6/2019 | Elsayed | G05F 1/565 |
| 2020/0278708 | A1* | 9/2020 | Tesch | G05F 3/30 |

OTHER PUBLICATIONS

Ge, Guang et al., A Single-Trim CMOS Bandgap Reference With a 3σ Inaccuracy of ±0.15% From −40° to 125° C., IEEE Journal of Solid-State Circuits, Nov. 2011, pp. 2693-2701, vol. 46, No. 11.

* cited by examiner

*Primary Examiner* — Thienvu V Tran
*Assistant Examiner* — Shahzeb K Ahmad
(74) *Attorney, Agent, or Firm* — Brian D. Graham; Frank D. Cimino (57) ABSTRACT

An electronic device includes a precision reference circuit, which contains a bandgap reference circuit and an offset-correction circuit. The bandgap reference circuit has an output that is coupled to provide a bandgap reference voltage and an intermediate node that is separated from the output by a transimpedance resistor. The offset-correction circuit is coupled to the bandgap reference circuit and includes a DAC. The DAC is coupled to the intermediate node and is also coupled to receive an external digital value. The external digital value determines a fraction of a correction current that will be passed by the DAC.

20 Claims, 10 Drawing Sheets

PRECISION REFERENCE CIRCUIT

BACKGROUND

A bandgap reference circuit, which is designed for the least variation across process, voltage and temperature (PVT), has an output voltage around the bandgap voltage of silicon, i.e., 1.16 V. When an application requires a fixed voltage reference that is different from the bandgap voltage, a typical solution adds a gain stage to raise the output voltage. The added gain stage introduces additional noise, offset and temperature drift, which can lead to performance degradation of the reference voltage. Improved solutions are desirable.

SUMMARY

Disclosed embodiments eliminate the gain or buffer stage used to produce the reference voltage from the bandgap voltage. Instead, a current digital-to-analog converter (DAC) is added to provide the difference between the bandgap output and the desired reference voltage. The bias current for the DAC is derived from the attenuated bandgap voltage and achieves reduced noise and temperature drift. The DAC current builds extra voltage at the output of the bandgap that can be either added or subtracted. Since this additional generated voltage is only a fraction of the voltage used to generate the bias currents for the DAC, all the circuit imperfections from the DAC and bias circuits will be attenuated. Thus, by the architecture of the correction circuit, imperfections of the correction circuit are attenuated at the reference output. The present solution offers the ability to translate the bandgap voltage to any reference voltage without using a gain or buffer stage and also provides programmability of the current source used to provide the added voltage.

In one aspect, an embodiment of an electronic device is disclosed. The electronic device includes a bandgap reference circuit having an output that is coupled to provide a bandgap reference voltage and an intermediate node that is separated from the output by a transimpedance resistor; and an offset-correction circuit that is coupled to the bandgap reference circuit and that includes a digital-to-analog converter (DAC), the DAC being coupled to the intermediate node and being further coupled to receive an external digital value, the external digital value determining a fraction of a correction current to be passed by the DAC.

In another aspect, an embodiment of a method of operating a voltage reference circuit is disclosed. The method includes utilizing a DAC to add a correction voltage to a bandgap reference voltage to produce a precision reference voltage; and providing the precision reference voltage to a circuit.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As mentioned above, a bandgap reference circuit is designed to have very low variation across process, voltage and temperature and provides an output voltage around 1.16 V. Most practical applications in which a reference voltage is necessary require a fixed voltage reference, but the reference voltage is frequently different from the bandgap voltage. To solve the difference, existing solutions will generally add a gain stage. However, an added gain stage introduces extra noise, offset and temperature drift leading to performance degradation of the reference voltage, as will be shown below. Prior to discussing the disclosed precision reference circuit, the present application will review how a bandgap reference circuit may achieve very low differences across temperature, voltage and process, followed by a discussion of the shortcomings of existing precision reference circuits.

Figure 7:
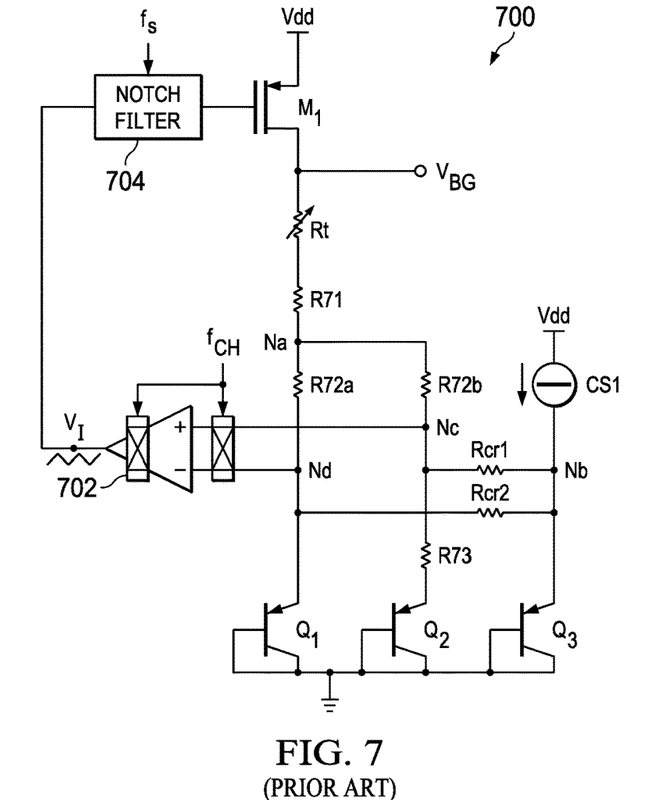
FIG. 7 depicts a bandgap reference circuit according to the prior art.

FIG. 7 depicts a specific bandgap reference circuit according to the prior art. Bandgap reference circuit 700 was first disclosed in the reference by G. Ge, C. Zhang, G. Hoogzaad and K. A. A. Makinwa, "A Single-Trim CMOS Bandgap Reference With a 3σ Inaccuracy of ±0.15% From ±40° C. to 125° C.," in *IEEE Journal of Solid-State Circuits*, vol. 46, no. 11, pp. 2693-2701, November 2011, which is hereby incorporated by reference in its entirety. Bandgap reference circuit 700 includes a P-type field effect transistor (PFET) M1 that is coupled in series with a variable resistor Rt, resistor R71, resistor R72a and first bipolar transistor Q1 between upper supply voltage Vdd and the lower supply voltage, which may be a ground plane. Resistor R72b is coupled in series with resistor R73 and second bipolar transistor Q2 between a node Na, which lies between resistor R71 and resistor R72a, and the lower supply voltage.

Additionally, a current source CS1 is coupled in series with a third bipolar transistor Q3 between the upper supply voltage and the lower supply voltage. Correction resistor Rcr1 is coupled between node Nb, which lies between the current source CS1 and the third bipolar transistor Q3, and node Nc, which lies between resistor R72b and resistor R73. Correction resistor Rcr2 is coupled between node Nb and node Nd, which lies between resistor R72a and first bipolar transistor Q1. An operational amplifier 702 has a non-inverting input that is coupled to node Nc, an inverting input that is coupled to node Nd and an output that is coupled to the gate of PFET M1 through a notch filter 704.

Error sources for a typical complementary metal oxide silicon (CMOS) bandgap reference circuit are shown in Table 1 following, with an indication whether or not the error is proportional to absolute temperature (PTAT):

TABLE 1

| Type of error | Variation | Error contribution | Type |
|---|---|---|---|
| *Opamp offset** | ±10 mV | ±8% | Non PTAT |
| BJT current gain | ±50% | ±0.035% | Non PTAT |
| *Curvature of Vbe | 3 mV–4 mV | ±0.2% | Non PTAT |
| Resistor spread | ±30% | ±0.6% | PTAT |
| Resistor mismatch | ±0.6% | ±0.02% | PTAT |
| BJT base resistance | ±5% | ±0.001% | Non PTAT |

The PTAT-based errors can generally be eliminated by trimming variable resistor Rt, leaving the non-PTAT errors, of which the most significant are the operational amplifier offset and the curvature of Vbe.

The Ge et al. reference notes that using a chopped operational amplifier as operational amplifier 702 can cancel the operational amplifier offset, which is the largest contributor to error. Additionally, coupling node Nb, which provides a current that is complementary to absolute temperature (CTAT), to node Nc through first correction resistor Rcr1 and coupling node Nb to node Nd through second correction resistor Rcr2 provides curvature correction to reduce the temperature dependency of the base emitter voltage. With these built-in elements, the remaining errors are mainly PTAT and can generally be removed by a room temperature trim of variable resistor Rt.

Figure 8:
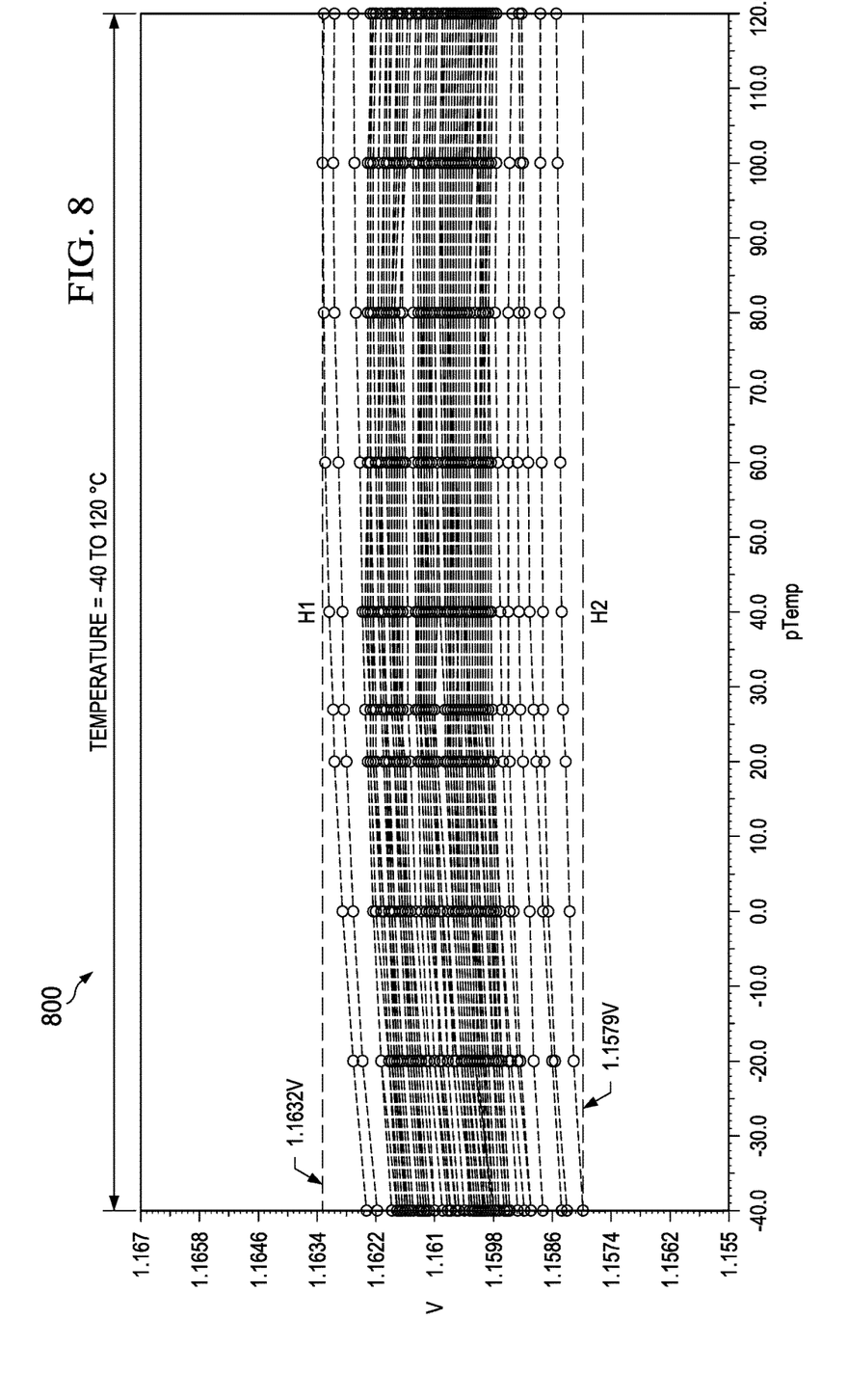
FIG. 8 depicts a graph of the output voltage versus the temperature for multiple embodiments of the bandgap reference circuit of FIG. 7.

However, using bandgap reference circuit 700, variability across process can still remain. FIG. 8 depicts a graph 800 depicting the temperature variations for a Monte Carlo simulation of both process and mismatch for the bandgap reference circuit 700. As seen in graph 800, the temperature variation for each run across the range of –40° through 120° C. is quite low, but the variations across the different runs vary from a low value of 1.1579 V to 1.1632 V, for a total variation of ±2.65 mV. This amount of variation is considered unacceptable for many of the applications in which the reference current will be utilized. Additionally, the variations shown in graph 800 do not include the variations and errors introduced by the additional circuits used to bring the bandgap reference voltage up from the average voltage of 1.16 V to the desired value for the precision reference voltage, which in one embodiment is 1.2 V.

Figure 9:
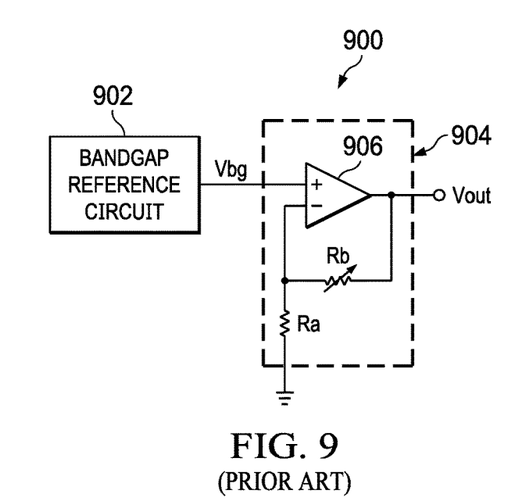
FIG. 9 depicts a block diagram of a precision reference circuit according to the prior art.

FIG. 9 depicts a block diagram of a typical precision reference circuit 900. Precision reference circuit 900 includes a bandgap reference circuit 902 and a gain circuit 904 that includes an operational amplifier 906 and two resistors—fixed resistor Ra and variable resistor Rb. Bandgap reference circuit 902 provides bandgap reference voltage Vbg to the non-inverting input of operational amplifier 906. A feedback loop that includes variable resistor Rb is coupled to the inverting input of operational amplifier 906 and fixed resistor Ra has a first terminal coupled to a node between variable resistor Rb and the inverting input of operational amplifier 906 and a second terminal coupled to the lower supply voltage, which may be a ground plane. The output voltage Vout of the precision reference circuit 900 is produced as the bandgap reference voltage Vbg multiplied times a factor that can be adjusted to provide the desired reference voltage, as demonstrated by the following equation:

$$Vout = \left(1 + \frac{Rb}{Ra}\right) \times Vbg \quad [1]$$

It will be understood that, as used in the present application, Ra and Rb can refer to either the resistor or the specific resistance of that resistor; the distinction should be clear from the context. The same is true of other resistors/resistances mentioned in the present application.

The amount of noise and offset provided by the gain circuit is demonstrated as shown in the following equations. It can be noted that the presence of $(1+Rb/Ra)$ in these equations, which reflects the fact that both the bandgap reference voltage Vbg and the desired additional voltage are processed by the gain circuit, ensures that both the offset and noise are increased.

Offset due to the operational amplifier 906, which is designated Voff,opamp, adds to the output voltage Vout as:

$$V_{off,opamp}^2 \left(1 + \frac{Rb}{Ra}\right)^2 \quad [2]$$

Offset due to resistors Ra and Rb contribute:

$$\left(V_{bg} \frac{Rb}{Ra} \frac{\Delta Rb}{Rb}\right)^2 \text{ and } \left(V_{bg} \frac{Rb}{Ra} \frac{\Delta Ra}{Ra}\right)^2 \quad [3]$$

The total offset and noise is thus:

$$V_{\textit{off},opamp}^2 \left(1 + \frac{Rb}{Ra}\right)^2 + \left(V_{bg} \frac{Rb}{Ra} \frac{\Delta Rb}{Rb}\right)^2 + \left(V_{bg} \frac{Rb}{Ra} \frac{\Delta Ra}{Ra}\right)^2 \quad [4]$$

Resistors Ra and Rb also add in power.

Noise from the operational amplifier, i.e., Vn,opamp, and from resistor Ra, i.e., Vn,Ra) add to output respectively as:

$$V_{\textit{off},opamp}^2 \left(1 + \frac{Rb}{Ra}\right)^2 \text{ and } V_{n,Ra}^2 \left(1 + \frac{Rb}{Ra}\right)^2 \quad [5]$$

Noise from Ra, i.e., $V_{n,Ra}^2$, appears directly at the output. Offset from the gain stage varies with temperature and adds extra temperature drift. The values of the total offset and noise reflect the degradation that is provided by the added circuitry to affect the resolution of the precision reference voltage. Improvements are needed to avoid degrading the bandgap further in forming the precision reference current.

Figure 1:
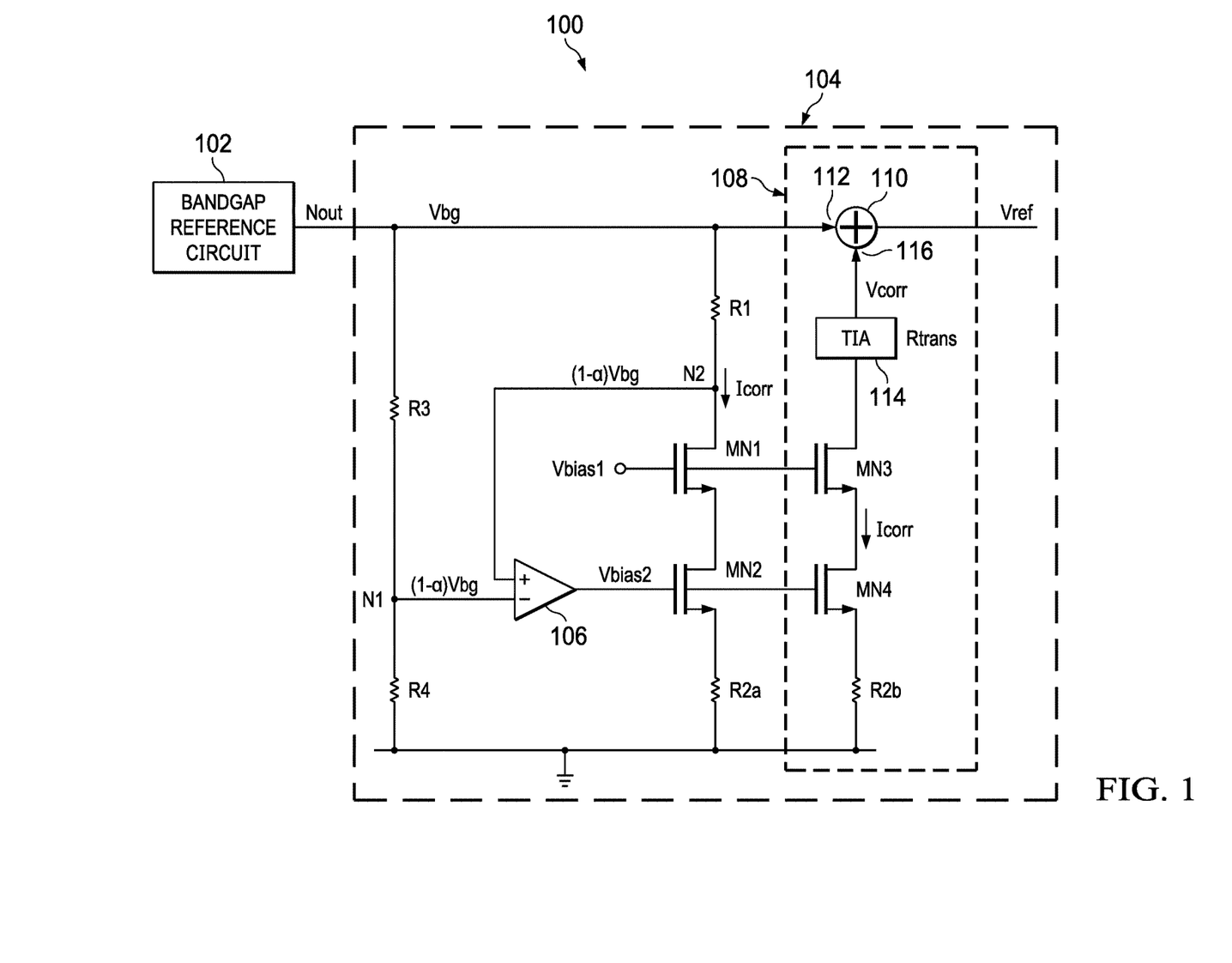
FIG. 1 depicts an equivalent circuit for a precision reference circuit according to an embodiment of the disclosure.

FIG. 1 illustrates the basic idea for disclosed precision reference circuit 100 using an equivalent circuit. Precision reference circuit 100 includes a bandgap reference circuit 102 and an offset-correction circuit 104. Within offset-correction circuit 104, a first resistor R1 is coupled in series with a first N-type field effect transistor (NFET) MN1, a second NFET MN2 and a second resistor R2a between an output Nout of the bandgap reference circuit 102, which provides a bandgap reference voltage Vbg, and a lower supply voltage, which in one embodiment is a ground plane. A third resistor R3 is also coupled in series with a fourth resistor between the output Nout of the bandgap reference circuit 102 and the lower supply voltage. A gate of first NFET MN1 is coupled to receive a first bias voltage Vbias1. An operational amplifier 106 has an inverting input coupled to a first node N1 that lies between the third resistor R3 and the fourth resistor R4, a non-inverting input coupled to a second node N2 that lies between the first resistor R1 and the first NFET MN1 and an output coupled to a gate of second NFET MN2 to provide a second bias voltage Vbias2.

In the circuit shown, offset-correction circuit 104 further includes an offset-adding circuit 108. As part of offset-adding circuit 108, adder 110 has a first input 112 coupled to the output Nout of bandgap reference circuit 102 and an output coupled to provide the desired precision reference voltage Vref. A transimpedance amplifier (TIA) 114 is coupled in series with a third NFET MN3, a fourth NFET MN4 and a further resistor R2b between a second input 116 of adder 110 and the lower supply voltage. Fourth NFET MN4 is sized the same as second NFET MN2 and a gate of fourth NFET MN4 is coupled to the gate of second NFET MN2 and to the output of operational amplifier 106. Third NFET MN3 is sized the same as first NFET MN1 and receives first bias voltage Vbias1 on a respective gate. Fourth NFET MN4 is sized the same as second NFET MN2 and has a gate that is also coupled to the output of operational amplifier 106. Resistor R2b has a same resistance as second resistor R2a and TIA 114 has a transimpedance of Rtrans.

At the circuit level, an attenuated version of bandgap reference voltage Vbg is generated using the resistor ladder formed by third resistor R3 and fourth resistor R4, such that a voltage of (1−α)Vbg is provided at the inverting input of operational amplifier 106, where a is equal to R3/(R3+R4). The voltage across resistor R1 is set such that the voltage drop across resistor R1 is αVbg, so that the non-inverting input of operational amplifier 106 also receives a voltage of (1−α)Vbg. The output voltage of operational amplifier 106 controls a current source that includes first NFET MN1, second NFET MN2 and second resistor R2a and that provides a correction current Icorr equal to αVbg/R1. Because third NFET MN3 and fourth NFET MN4 are controlled by the same bias voltages as first NFET MN1 and second NFET MN2, correction current Icorr is also presented to the input of TIA 114 which generates a correction voltage Vcorr equal to αVbg(Rtrans/R1) on the second input 116 of adder 110. Correction voltage Vcorr is added to bandgap reference voltage Vbg to create the precision reference voltage Vref. Thus, unlike the prior art processes that multiply the bandgap reference voltage Vbg times a factor to obtain the precision reference voltage Vref, precision reference circuit 100 adds a correction voltage Vcorr to bandgap reference voltage Vbg to achieve precision reference voltage Vref. Typically, α, i.e. the ratio of R3:R4, can provide a voltage at first node N1 that is around twenty percent (20%) of the bandgap voltage. Because of the design, which takes a voltage and generates a current, the offset of the amplifier is not critical. For example, when Rtrans/R1 is 0.2, the noise contribution is 0.04, as will be shown in the equations below.

In one embodiment, the voltage drop across resistor R1 is set to αVbg, where α is equal to R3/(R3+R4). The voltages taken at first node N1 and second node N2 are thus both equal to (1−α)Vbg. A correction current Icorr that is passed through first resistor R1, first NFET MN1, second NFET MN2 and second resistor R2a is equal to αVbg/R1. Correction current Icorr also flows through third NFET MN3, fourth NFET MN4 and further resistor R2b to be presented at the input of transimpedance amplifier 114, which provides correction voltage Vcorr at the second input of adder 110 of:

$$V_{corr} = \alpha V_{bg} \frac{R_{trans}}{R_1} \quad [6]$$

For the precision reference voltage Vref, the noise from offset-correction circuit 104 is proportional to:

$$V_{bg} \frac{R_{trans}}{R_1} \quad [7]$$

The offset and noise of operational amplifier 106 that is referred to precision reference voltage Vref is:

$$V_{\textit{off},opamp} \times \frac{R_{trans}}{R_1} \quad [8]$$

Wherein Voff,opamp is the offset of operational amplifier 106. The offset and noise of the current sources referred to operational amplifier input is:

$$V_{\textit{off},I1,I2} \left(\frac{R_1}{R_2}\right) \quad [9]$$

Where Voff,I1,I2 is the offset between the threshold voltages Vt of second NFET MN2 and fourth NFET MN4.

The noises referred to precision reference voltage Vref is:

$$V_{off,J1,J2}^2 \left(\frac{R_{trans}}{R_2}\right) \quad [10]$$

The closer the value of α is to 1, the lower the value of Rtrans/R1 needs to be, because this provides better rejection. The total noise and offset contribution is:

$$V_{off,opamp}^2 \left(\frac{R_{trans}}{R1}\right)^2 + (V_{off,J1}^2 + V_{off,J2}^2)\left(\frac{R_{trans}}{R2}\right)^2 \quad [11]$$

Offset-correction circuit 104 may provide one or more of the following advantages over the prior art:
  Only the voltage that needs to be added to the bandgap reference voltage Vbg is processed;
  The noise and offset from the offset-correction circuit are attenuated by Rtrans/R1, which is set to be less than one. This means that only a fraction of the offset is seen on the output; and
  As will be shown, transimpedance amplifier 114 can be integrated into the feedback network of the bandgap circuit 102 without adding any extra circuits, as will be shown.

Figure 2:
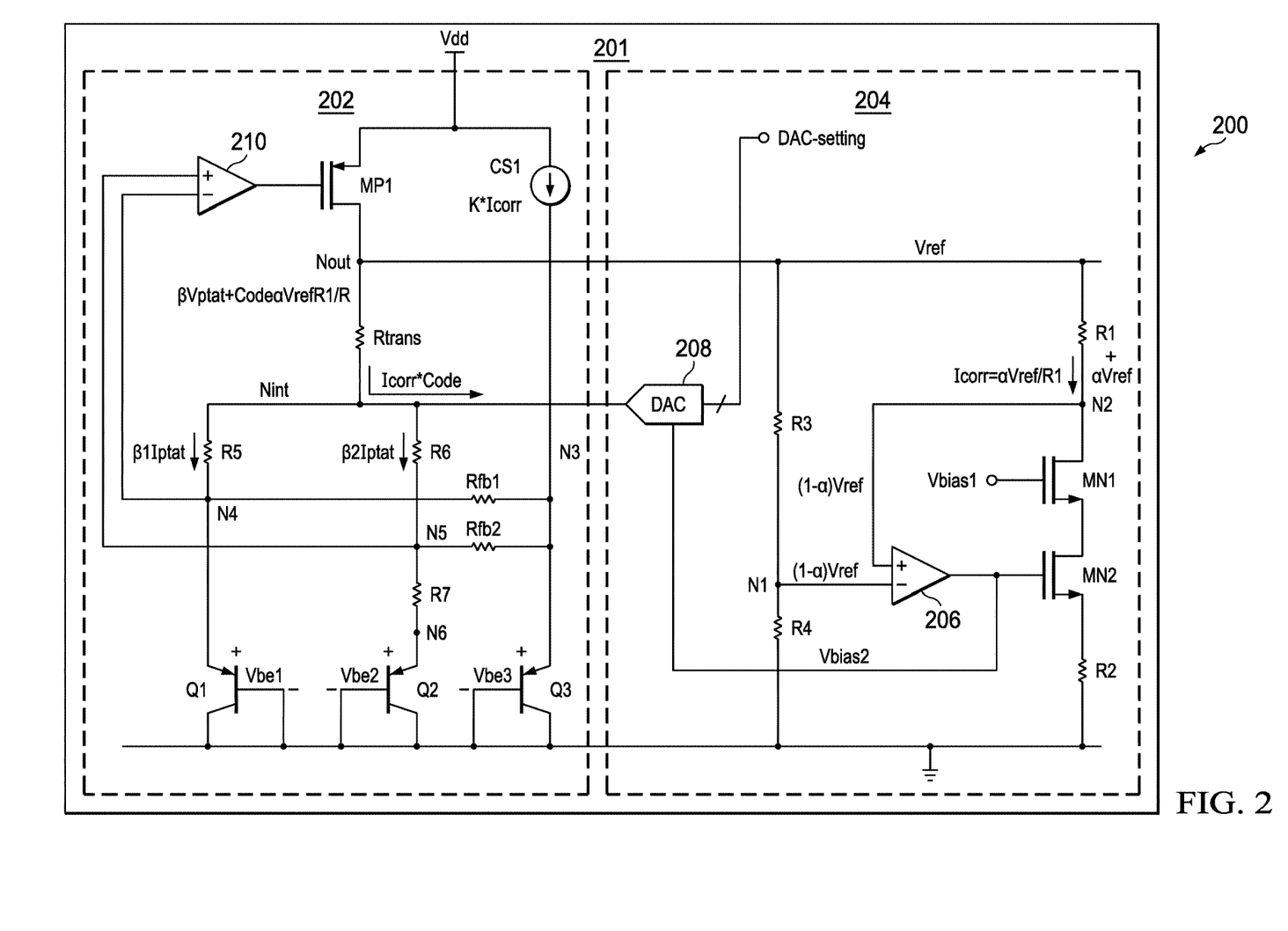
FIG. 2 depicts an example of a precision reference circuit integrated to a bandgap circuit according to an embodiment of the disclosure.

FIG. 2 depicts precision reference circuit 200, which is an implementation of precision reference circuit 100 according to an embodiment of the disclosure. Precision reference circuit 200 is shown here as part of an integrated circuit (IC) chip 201, which can be a stand-alone IC chip or part of a larger IC chip. Precision reference circuit 200 includes bandgap reference circuit 202 and offset-correction circuit 204, which adds a correction voltage Vcorr to the bandgap reference voltage Vbg to achieve precision reference voltage Vref. As will be explained, transimpedance resistor Rtrans, which is an existing resistor in the bandgap reference circuit 202, works as the transimpedance amplifier to convert an offset-correction current to an offset-correction voltage that is added to the bandgap reference voltage Vbg to provide precision reference voltage Vref, so that extra components are avoided.

Offset-correction circuit 204 again includes first resistor R1 coupled in series with first NFET MN1, second NFET MN2 and second resistor R2 between the output Nout of bandgap reference circuit 202 and the lower supply voltage, which can be a ground plane. The gate of first NFET MN1 receives a first bias voltage Vbias1 and second node N2 is equal to (1−α)Vref. Third resistor R3 and fourth resistor R4 are again coupled between the output Nout of bandgap reference circuit 202 and the lower supply voltage. First operational amplifier 206 has an inverting input coupled to first node N1 between third resistor R3 and fourth resistor R4, a non-inverting input coupled to second node N2 between first resistor R1 and first NFET MN1, and an output coupled to provide a second bias voltage Vbias2, which drives the gate of second NFET MN2. The offset-adding circuit 108 of precision reference circuit 100 is replaced by DAC 208, second bias voltage Vbias2 from first operational amplifier 206, an external digital value DAC-setting that can be individualized for each chip, and transimpedance resistor Rtrans, which is a part of bandgap reference circuit 202 and which is coupled to DAC 208 through an intermediate node Nint.

It will be recognized that bandgap reference circuit 202 is similar to the bandgap reference circuit 700 is FIG. 7, although the names of many of the elements are changed in this figure. Bandgap reference circuit 202 includes a second operational amplifier 210 that is coupled to drive the gate of first PFET MP1. First PFET MP1 is coupled in series with transimpedance resistor Rtrans between the upper supply voltage Vdd and the intermediate node Nint that is coupled to DAC 208. A fifth resistor R5 is coupled in series with a first bipolar transistor Q1 between the intermediate node Nint and the lower supply voltage. Sixth resistor R6 and a seventh resistor R7 are coupled in series with a second bipolar transistor Q2 between the intermediate node Nint and the lower supply voltage. Finally, a current source CS1 is coupled in series with a third bipolar transistor Q3 between the upper supply voltage Vdd and the lower supply voltage to provide a current that is a multiple K times the correction current Icorr.

An inverting input of second operational amplifier 210 is coupled to a third node N3 through a first feedback resistor Rfb1 and is further coupled to a fourth node N4 that lies between the fifth resistor R5 and the first bipolar transistor Q1. A non-inverting input of second operational amplifier 210 is coupled to the third node N3 through a second feedback resistor Rfb2 and is further coupled to a fifth node N5 that lies between sixth resistor R6 and seventh resistor R7. An embodiment of DAC 208 is discussed next and will be followed by a further explanation of the overall circuit.

Figure 3:
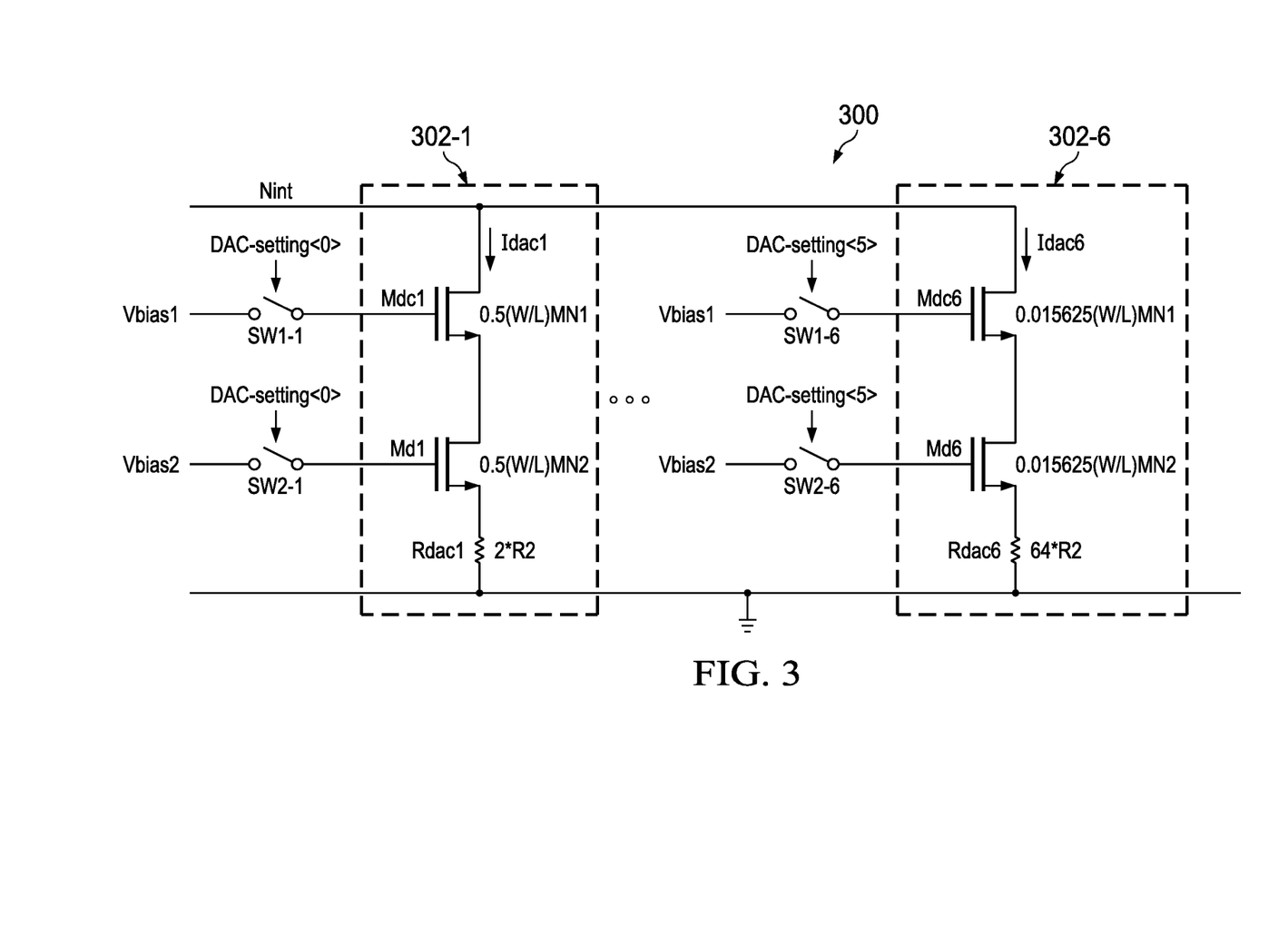
FIG. 3 depicts a DAC according to an embodiment of the disclosure.

FIG. 3 depicts a DAC circuit 300 that can be used as DAC 208 according to an embodiment of the disclosure. In one embodiment, external digital value DAC-setting has 6 bits and DAC circuit 300 contains six DAC elements 302-1 through 302-6. This example embodiment will be discussed herein, although, it will be understood that the external digital value DAC-setting can have a different number of bits and DAC circuit 300 can contain a corresponding number of DAC elements. Each of DAC elements 302-1 through 302-6 contains a respective first bias NFET Mdcn coupled in series with a respective second bias NFET Mdn and a respective DAC resistor Rdacn between the intermediate node Nint of the bandgap reference circuit 202 and the lower supply voltage, where 'n' indicates the position of the DAC element in DAC circuit 300. A gate of each respective first bias NFET Mdcn is coupled through a respective first switch SW1-$n$ to the first bias voltage Vbias1 and a gate of each second bias NFET Mdn is coupled through a respective second switch SW2-$n$ to receive second bias voltage Vbias2 whenever that DAC element is active.

The individual components of DAC element 302-$n$ are scaled to carry a current that is equal to correction current Icorr divided by two to the nth power, i.e.:

$$I_{dacn} = \frac{I_{corr}}{2^n} \quad [12]$$

where Idacn is the current through DAC element n. This is achieved by setting the width to length ratio of first bias NFET Mdcn to be equal to the width to length ratio of first NFET M1 divided by two to the nth power, i.e., $$\left(\frac{W}{L}\right)Mdcn = \frac{\left(\frac{W}{L}\right)MN1}{2^n}, \quad [13]$$

sizing the width and length of second bias NFET Mdn to be equal to the width and length of second NFET M2 divided by two to the nth power, i.e., $$\left(\frac{W}{L}\right)Mdn = \frac{\left(\frac{W}{L}\right)MN2}{2^n} \quad [14]$$

and sizing DAC resistor Rdacn to have a resistance of R2 times two to the power of n, i.e., $$Rdacn = 2^n R2$$

For example, in the embodiment shown if DAC 300, DAC resistor Rdac1 has a resistance of 2*R2, the width/length ratio of the gate of first bias NFET Mdc1 is one half the width/length ratio of the gate of first NFET M1, and the width/length ratio of the gate of second bias NFET Md1 is one half the width/length ratio of the gate of second NFET M2. Additionally, each DAC element 302-n receives a respective bit of external digital value DAC-setting that controls whether or not that DAC element is active in the circuit by coupling or decoupling the gate of the first bias NFET Mdcn and the gate of the second bias NFET Mdn to respective bias voltages. DAC element 302-1 receives the most significant bit and DAC element 302-6 receives the least significant bit of the external digital value DAC-setting. Each of DAC elements 302 are thus passing a proportional fraction of a current that mirrors correction current Icorr. The total current passed by DAC 208 will be equal to Icorr*Tcode, where Tcode is a value that depends on the external digital value DAC-setting.

Table 2 illustrates a correspondence between a few exemplary values of the external digital value DAC-setting and the corresponding value of the trim code Tcode:

TABLE 2

| DAC-setting | Tcode |
|---|---|
| 0 | 0 |
| 1 | 0.015625 |
| 2 | 0.03125 |
| 16 | 0.25 |
| 32 | 0.5 |
| 48 | 0.75 |
| 64 | 1.0 |

If the default external digital value DAC-setting is 32, then when the precision reference voltage for a particular IC chip is lower than desired, an external digital value DAC-setting that is higher than 32 can be selected and when the particular precision reference voltage is higher than desired, an external digital value DAC-setting that is lower than 32 can be selected to provide an appropriate adjustment.

In one embodiment, precision reference circuit 200 is designed for a value of external digital value DAC-setting that lies near the midpoint in the range of possible values. This can allow small variations from the designed value to be made during production in order to reduce the variations between individual chips. Thus, the DAC has added programmability to the current source to adjust the output voltage of precision reference circuit 200. It will be understood that DAC 300 has been discussed above using NFETs, but PFETs can also be utilized, in which case correction current Icorr has a negative voltage and can subtract voltage from the bandgap reference voltage Vbg.

During operation of precision reference circuit 200 without the addition of DAC 208, the current through first PFET MP1 is designated βIptat. The current through the fifth resistor R5 and first bipolar transistor Q1 is β1Iptat and the current through the sixth resistor R6, seventh resistor R7 and second bipolar transistor is β2Iptat, where β1 and β2 are the gain through their respective segments and β=β1+β2. Second operational amplifier 210 is essentially in a negative feedback loop that includes the currents through fifth resistor R5 and sixth resistor R6, which means that these two currents will remain stable during operation. When precision reference circuit 200 is operated with offset-correction circuit 204, the current through DAC 208, which is equal to the correction current times the trim code Tcode, is added to the intermediate node Nint. Because the currents β1Iptat and β2Iptat cannot change, there is no other place for the current to flow than through transconductance resistor Rtrans. If the external digital value DAC-setting has been correctly determined, the voltage at the output Nout of bandgap reference circuit 202 is increased to create the desired precision voltage reference Vref. The equations to support this statement are shown below:

If we let Vn4 and Vn5 be the voltages at fourth node N4 and fifth node N5 respectively, we know that the $$Vn4 = Vn5$$

because of the negative feedback loop through second operational amplifier 210. We also know that β2Iptat is equal to the current through sixth resistor R6, which is also equal to the current through seventh resistor R7. Therefore, $$\beta 2Iptat = \frac{Vn5 - Vn6}{R7} = \frac{Vbe1 - vbe2}{R4} \quad [17]$$

where Vn6 is the voltage at sixth node N6 and Vbe1 and Vbe2 are the respective base/emitter voltages of first bipolar transistor Q1 and second bipolar transistor Q2. Since Vn4=Vn5, $$Vint - Vn4 = Vint - Vn5$$

where Vint is the voltage at intermediate node Nint.

$$\beta 1IptatR5 = \beta 2IptatR6 \quad [19]$$

$$\beta 1R5 = \beta 2R6 \quad [20]$$

$$\frac{\beta 1}{\beta 2} = \frac{R6}{R5} \quad [21]$$

To find the value of precision reference voltage Vref, we refer to Kirshoff's voltage law to determine Vref via first bipolar transistor Q1, fifth resistor R5 and transimpedance resistor Rtrans:

$$Vref - 0 = Vbe1 + R5\beta 1Iptat + RtransItrans \quad [22]$$

where Itrans is the current through resistor Rtrans.

$$= Vbe1 + R5\beta 1Iptat + Rtrans((\beta 1 + \beta 2)Iptat + IcorrTcode) \quad [23]$$

$$= Vbe1 + R5\beta 1Iptat + Rtrans(\beta 1 + \beta 2)Iptat + RtransIcorrTcode \quad [24]$$

This last element, RtransIcorrTcode, is the voltage added by DAC 208 to precision reference voltage Vref.

Figure 2A:
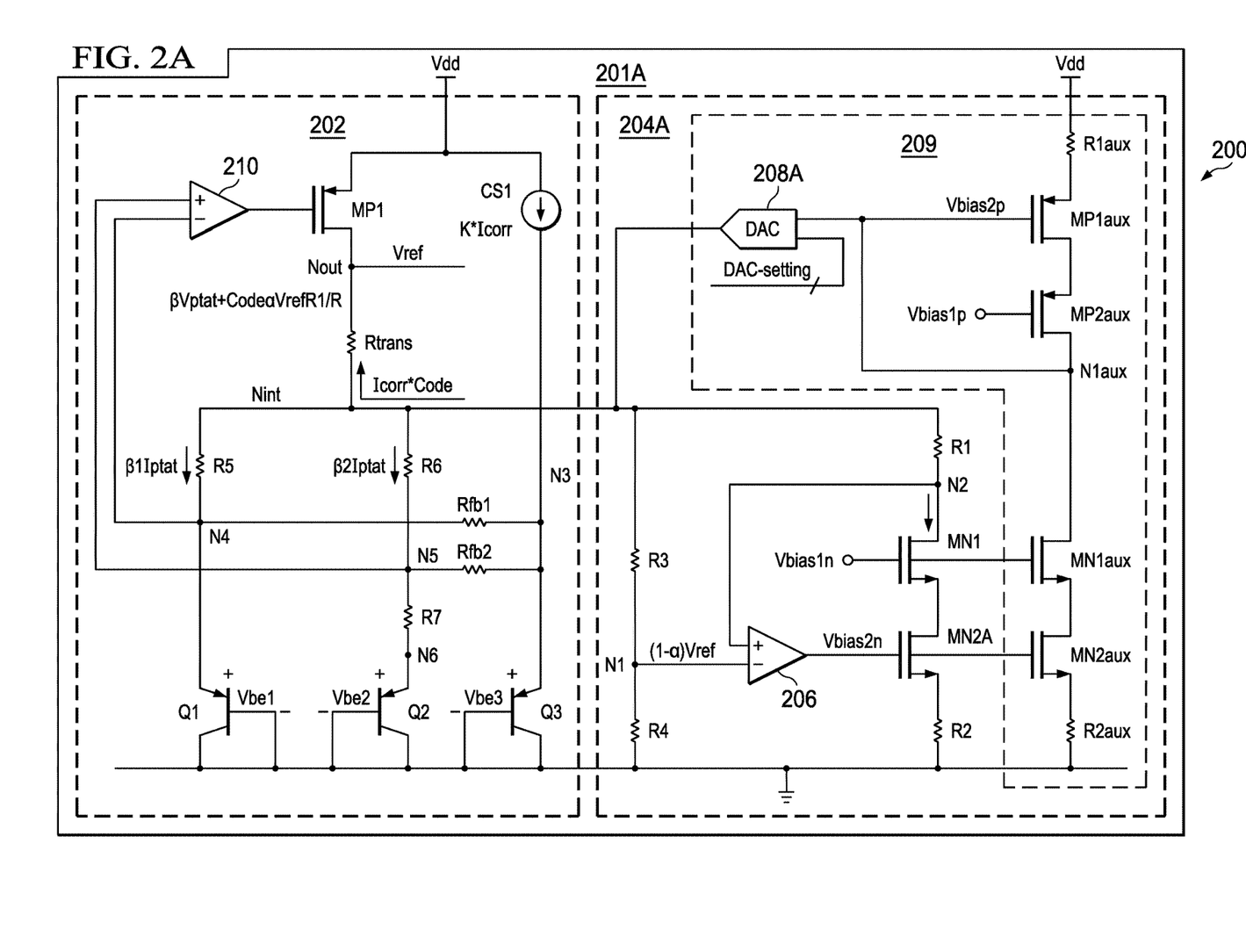
FIG. 2A depicts an example of a precision reference circuit integrated to a bandgap circuit according to an embodiment of the disclosure.
Figure 3A:
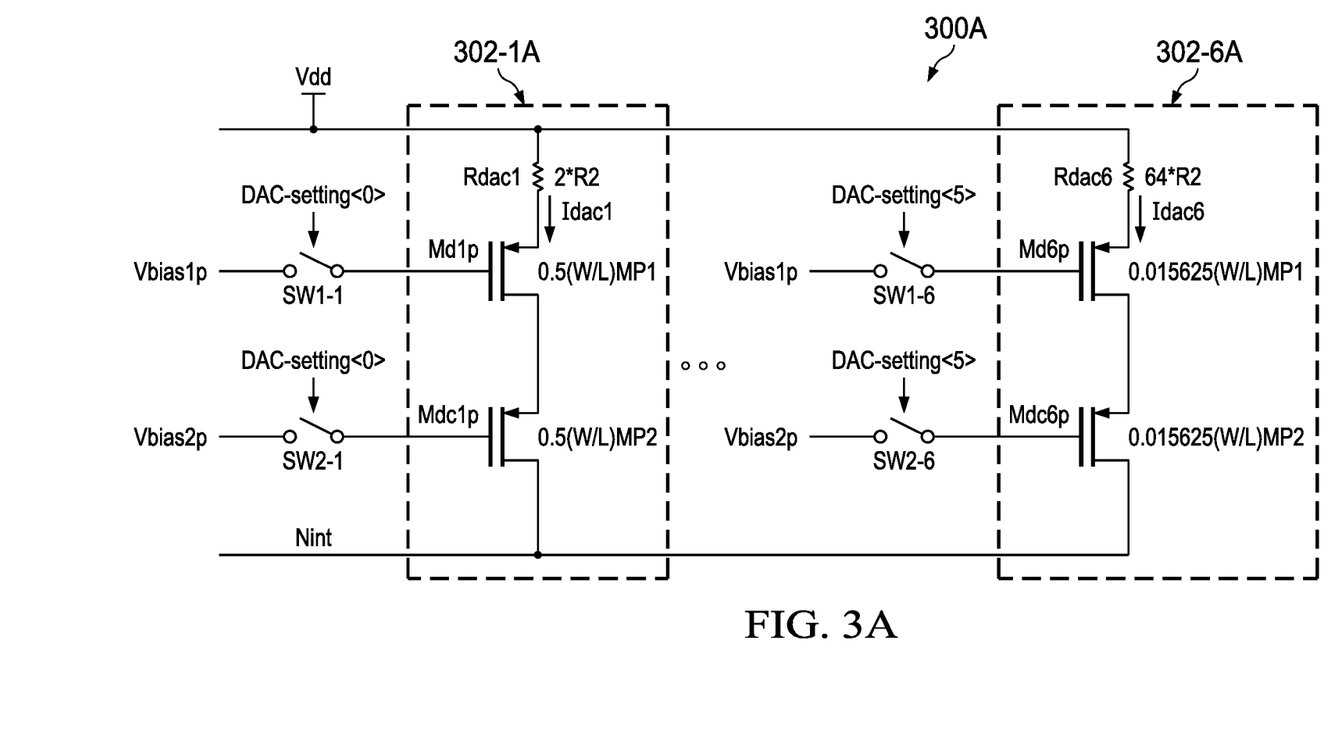
FIG. 3A depicts a DAC according to an embodiment of the disclosure.

FIG. 2 and FIG. 3 depict respective embodiments of precision reference circuit 200 and DAC circuit 300 that are used to add a correction voltage Vcorr to the bandgap voltage Vbg. FIG. 2A and FIG. 3A depict respective embodiments of a precision reference circuit 200A and a DAC circuit 300A that can be used to subtract correction voltage Vcorr from the bandgap voltage Vbg.

Precision reference circuit 200A includes bandgap reference circuit 202 and a modified offset-correction circuit 204A. Offset-correction circuit 204A includes first resistor R1 coupled in series with first NFET MN1, second NFET MN2 and second resistor R2 between the intermediate node Nint of bandgap reference circuit 202 and the lower supply voltage. Third resistor R3 and fourth resistor R4 are coupled between intermediate node Nint and the lower supply voltage. First operational amplifier 206 has an inverting input coupled to first node N1 between third resistor R3 and fourth resistor R4, a non-inverting input coupled to second node N2 between first resistor R1 and first NFET MN1, and an output coupled to the gate of second NFET MN2 to provide a second N-type bias voltage Vbias2$n$.

An offset-subtracting circuit 209 includes a first auxiliary resistor R1aux coupled in series with a first auxiliary PFET MP1aux, a second auxiliary PFET MP2aux, a first auxiliary NFET MN1aux, a second auxiliary NFET MN2aux and a second auxiliary resistor R2aux between the upper voltage supply and the lower voltage supply, with a first auxiliary node N1aux being located between the second auxiliary PFET MP1aux and the first auxiliary NFET MN1aux. The gate of first auxiliary NFET MN1aux and the gate of first NFET MN1 are each coupled to receive a first N-type bias voltage Vbias1$n$ and the gate of second auxiliary NFET MN2aux is coupled to the output of first operational amplifier 206. DAC 208A has a first input, a second input and an output. The first input of DAC 208A is coupled to the gate of first auxiliary PFET MP1aux and is also coupled to the first auxiliary node N1aux. The gate of second auxiliary PFET MP1aux is coupled to receive a first P-type bias voltage Vbias1$p$, while the first auxiliary node N1aux provides a second P-type bias voltage Vbias2$p$. The second input of DAC 208A is coupled to receive the external digital value DAC-setting that can be individualized for each chip and the output of DAC 208A is coupled to the intermediate node Nint. Transimpedance resistor Rtrans is considered to be both a part of bandgap reference circuit 202 and a part of offset-subtracting circuit 209, thus saving components.

FIG. 3A depicts a DAC circuit 300A that can be used as DAC 208A according to an embodiment of the disclosure. In one embodiment, external digital value DAC-setting has 6 bits and DAC circuit 300A contains six DAC elements 302-1A through 302-6A, although the number of elementsd can be different. Each of DAC elements 302-1A through 302-6A contains a respective DAC resistor Rdacn coupled in series with a respective first bias PFET Mdnp and a respective second bias PFET Mdcnp between the upper supply voltage and intermediate node Nint of the bandgap reference circuit 202, where 'n' indicates the position of the DAC element in DAC circuit 300A. A gate of each respective first bias PFET Mdnp is coupled through a respective first switch SW1-$n$ to the first bias voltage Vbias1$p$ and a gate of each second bias NFET Mdcnp is coupled through a respective second switch SW2-$n$ to receive second bias voltage Vbias2$p$ whenever that DAC element is active.

Again, the individual components of DAC element 302-nA are scaled to carry a current that is proportional to correction current Icorr, such that the sum of currents passed by all of DAC elements 302-nA is equal to Icorr*Tcode, where Tcode is the value determined by the external digital value DAC-setting. During operation of DAC 300A and offset-correction circuit 204A, the addition of Icorr*Tcode to the current at intermediate node Nint is reflected through transimpedance resistor Rtrans by a voltage equal to Rtrans*Icorr*Tcode that is subtracted from bandgap reference voltage Vbg to create precision reference voltage Vref.

Figure 4:
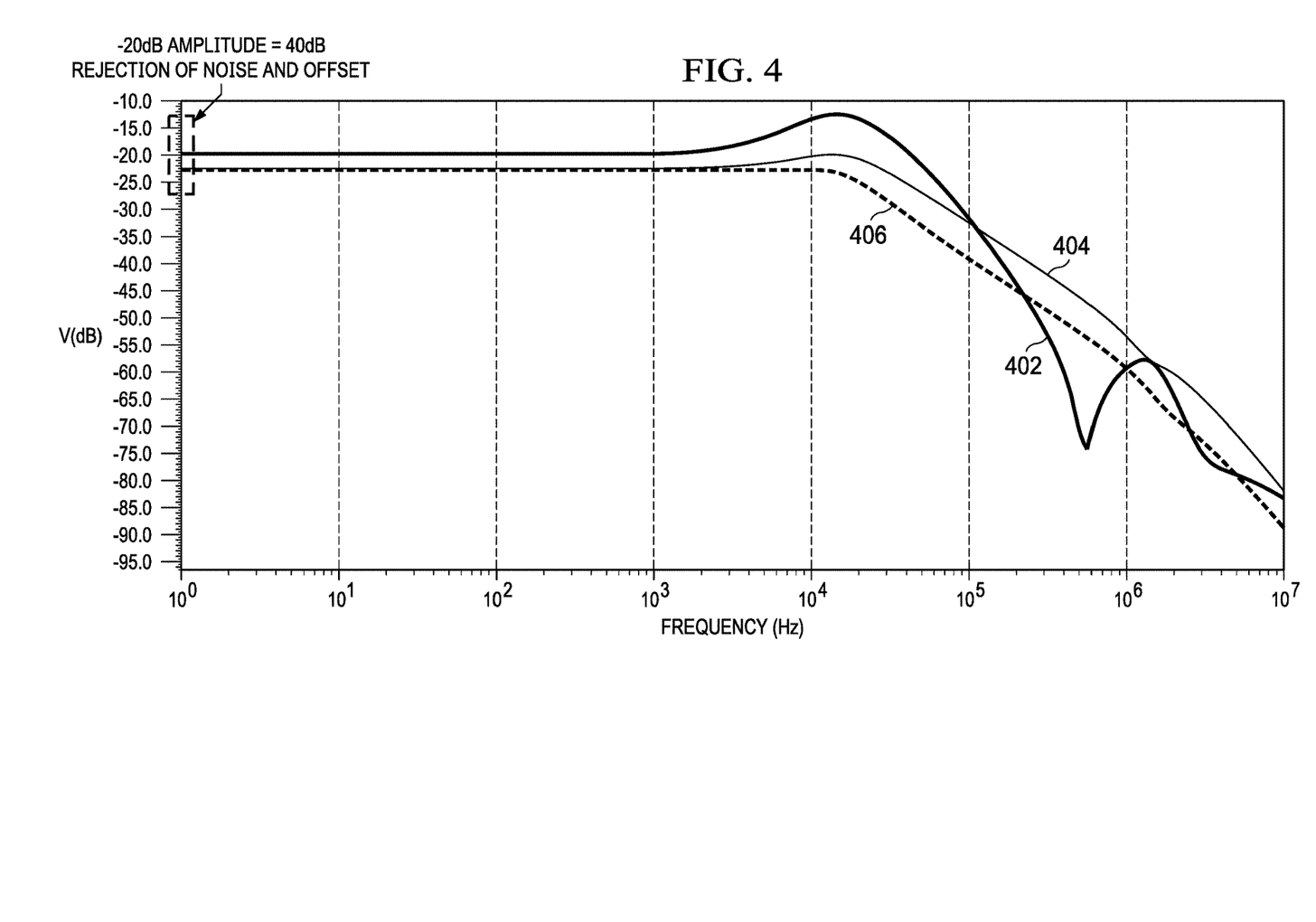
FIG. 4 depicts graphs of the noise transfer functions of the operational amplifier, DAC and mirror current source of FIG. 2 according to an embodiment of the disclosure.

FIG. 4 depicts a simulation of the noise referred to the output voltage from offset-correction circuit 204, i.e, the noise transfer functions from the inputs of first operational amplifier 206, the DAC 208 and the current source that includes second NFET MN2 and second resistor R2. The op amp noise transfer function is shown by curve 402, the current source noise transfer function is shown by curve 404 and the overall DAC noise transfer function is shown by curve 406. The transfer functions have a −20 dB direction. Remembering that noise is a voltage-squared function and decibels are a log function, when −20 dB is squared, the result is 40 dB rejection of noise and offset transfer functions. This means that unlike the prior art gain circuits, the offset-correction circuit 204 doesn't really determine the performance of the bandgap. The use of offset-correction circuit 204 means that the focus can be on making the bandgap reference circuit 202 very accurate, with less concern about the additional voltage to be added and corrected for.

Figure 5:
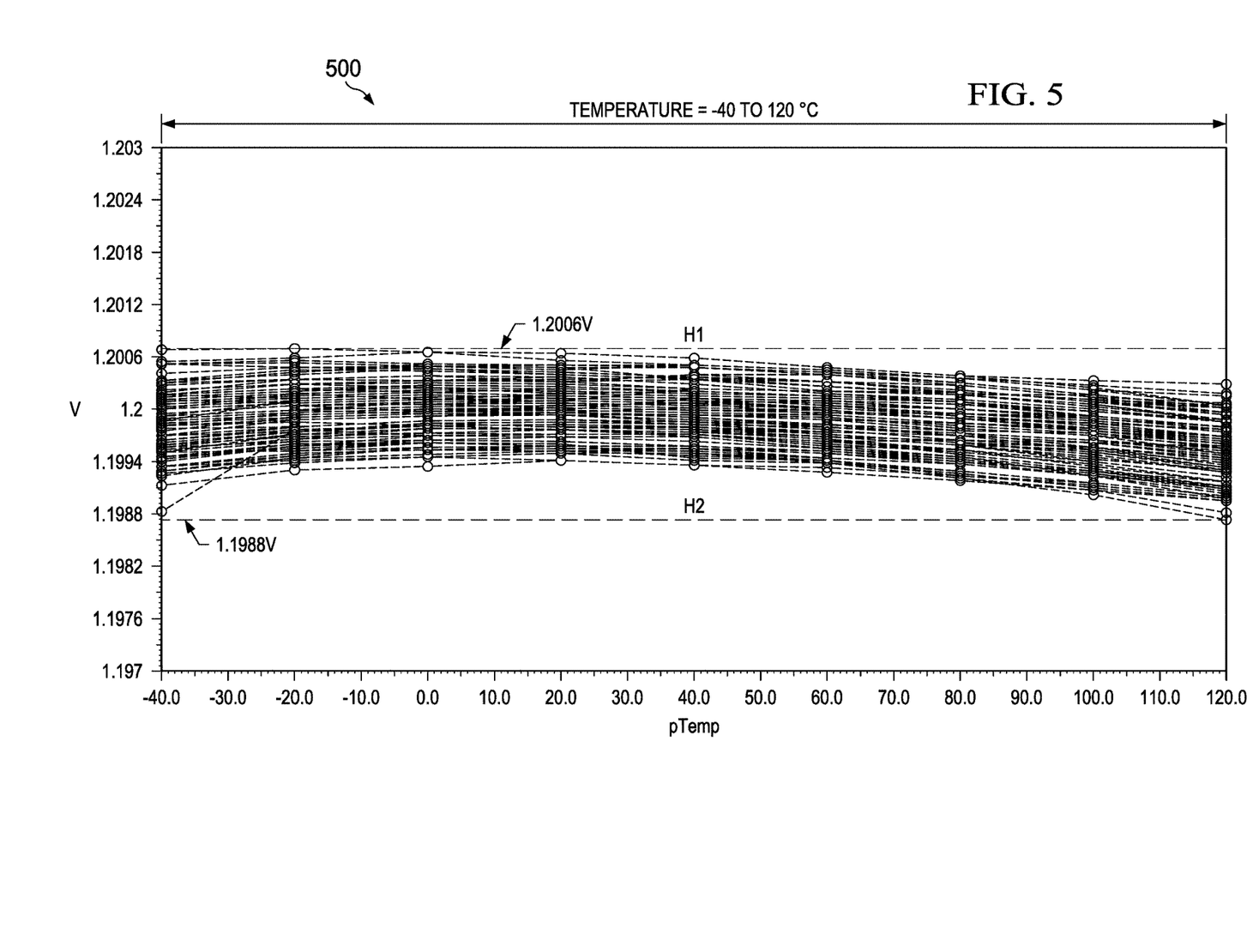
FIG. 5 depicts a graph of the output voltage versus the temperature for multiple embodiments of the circuit of FIG. 2 according to an embodiment of the disclosure.

FIG. 5 contains a graph 500 depicting the temperature variations for a Monte Carlo simulation of both process and mismatch for precision reference circuit 200. In graph 500, the temperature variation for each run across the range of −40° through 120° C. has remained quite low. However, the variations across the different runs have been notably decreased from the variations seen with just the bandgap reference circuit. The results now vary from a low value of 1.1988 V to 1.2006 V, for a total variation of ±900 ρV. Not only has offset-correction circuit 204 brought the average voltage output up to 1.1997 V, which is in the desired range, but the variation between runs is one third of the variation seen with the bandgap reference circuit alone.

Figure 6:
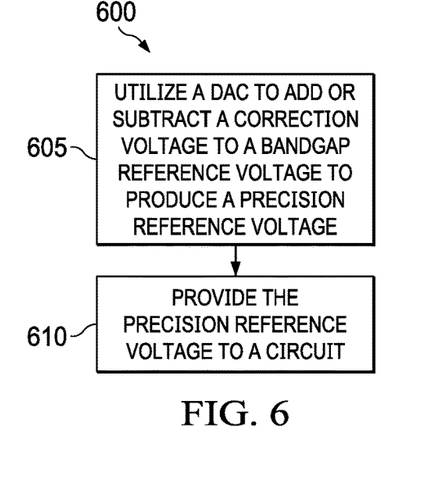
FIG. 6 depicts a method of operating a precision reference circuit integrated with a bandgap circuit according to an embodiment of the disclosure.

FIG. 6 depicts a method 600 of operating a precision reference circuit such as precision reference circuit 200. Method 600 begins with utilizing 605 a DAC to add or subtract a correction voltage to a bandgap reference voltage to produce a precision reference voltage and continues with providing 610 the precision reference voltage to a circuit. The circuit to which the precision reference voltage is provided can be any type of circuit that requires a precision reference voltage, e.g., a comparator, a sample-and-hold circuit, an analog-to-digital converter (ADC), a crystal oscillator, etc.

Figure 6A:
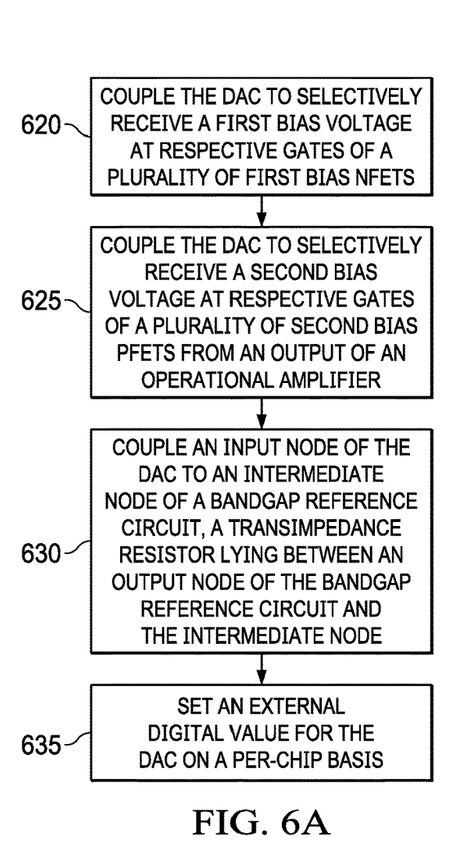
FIGS. 6A, 6B, and 6C expand upon the method of FIG. 6.

FIG. 6A depicts a flowchart having a number of elements of method 600 that may be performed prior to performing elements 605 and 610 and is directed to the embodiment of DAC 300. The DAC is coupled to selectively receive 620 a first bias voltage Vbias1 at respective gates of a plurality of the first bias NFETs, e.g., Mdc1-Mdc6, and to selectively receive 625 the second bias voltage Vbias2 at respective gates of the plurality of second bias NFETs, e.g. Md1-Md6, from an output of an operational amplifier, e.g., first operational amplifier 206. The input node of the DAC is coupled 630 to an intermediate node of a bandgap reference circuit in which a transimpedance resistor lies between an output of the bandgap reference circuit and the intermediate node. Finally, an external digital value for the DAC is set 635 on a per chip basis.

Figure 6B:
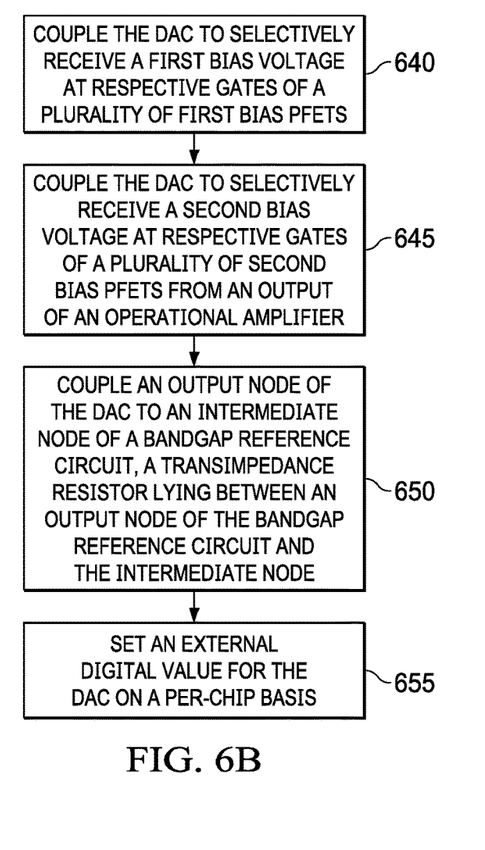

FIG. 6B depicts a flowchart having a number of alternate elements of method 600 that may be performed prior to performing elements 605 and 610 and is directed to the embodiment of DAC 300A. The DAC is coupled to selectively receive 640 a first bias voltage Vbias1 at respective gates of a plurality of the first bias PFETs, e.g., Mdc1p-Mdc6p, and to selectively receive 645 the second bias voltage Vbias2 at respective gates of the plurality of second bias PFETs, e.g. Md1p-Md6p, from an output of an operational amplifier, e.g., first operational amplifier 206. The output of the DAC is coupled 650 to an intermediate node of a bandgap reference circuit in which a transimpedance resistor lies between an output of the bandgap reference circuit and the intermediate node. Finally, an external digital value for the DAC is set 655 on a per chip basis.

Figure 6C:
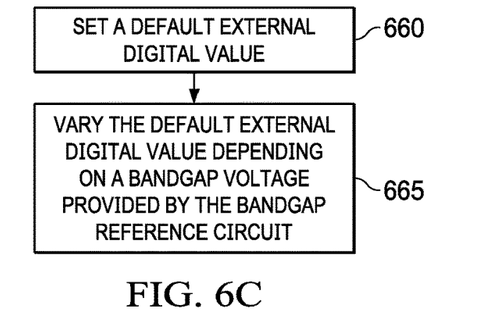

FIG. 6C depicts a flowchart that defines one method of setting the external digital value for the DAC on a per-chip basis. In this embodiment, a default external digital value is set 660, e.g. during the design and testing phase of the IC chip. The default external digital value is then varied 665 depending on a bandgap voltage provided by the specific bandgap reference circuit.

Applicants have disclosed a method of increasing accuracy of a bandgap circuit using a DAC based correction circuit. The circuit exhibits error rejection for both noise and offset, and hence helps to build a very precise bandgap reference circuit. The DAC can also provide the ability to program slightly different values input to the DAC in order to compensate for undesirable variations in the bandgap reference circuit. These capabilities are provided with only small increases in noise.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A circuit comprising:
a bandgap reference circuit including: a transistor having an output terminal; and a first resistor having first and second terminals, the first terminal of the first resistor coupled to the output terminal, in which the bandgap reference circuit is configured to provide a reference voltage at the output terminal; and
a reference voltage correction circuit including:
a digital-to-analog converter (DAC) having an output coupled to the second terminal of the first resistor and having an input;
second and third resistors, each having first and second terminals, the first terminal of the second resistor coupled to the output terminal, the second terminal of the second resistor coupled to the first terminal of the third resistor;
a current source coupled between the output terminal and the second terminal of the third resistor, the current source having a control input; and
an operational amplifier having first and second inputs and an output, the second input coupled to the second terminal of the second resistor and to the first terminal of the third resistor, the first input coupled to the current source, and the output of the operational amplifier coupled to the control input of the current source and to the input of the DAC.

2. The circuit as recited in claim 1, wherein the current source includes:
a fourth resistor having first and second terminals, the first terminal coupled to output terminal;
a first N-type field effect transistor (NFET) having a first terminal coupled to the second terminal of the fourth resistor and to the first input of the operational amplifier, and having a second terminal;
a second NFET having a first terminal coupled to the second terminal of the first NFET, having a second terminal, and having a gate coupled to the output of the operational amplifier and to the input of the DAC; and
a fifth resistor having a first terminal coupled to the second terminal of the second NFET, and having a second terminal coupled to the second terminal of the third resistor.

3. The circuit as recited in claim 2, wherein the DAC includes DAC elements, each DAC element including:
first and second switches; and
a respective third NFET coupled in series with a respective fourth NFET and a respective sixth resistor between the second terminal of the first resistor and a supply voltage terminal, in which a gate of the third NFET is coupled to the first switch to receive a first bias voltage and a gate of the fourth NFET is coupled to the second switch to receive a second bias voltage at the output of the first operational amplifier.

4. The circuit as recited in claim 3, wherein the first switch and the second switch of a respective DAC element are controlled by a respective bit of an externally provided digital value.

5. The circuit as recited in claim 4 wherein for an nth DAC element, the respective third and fourth NFETs and the respective sixth resistor are sized to pass a respective current that is equal to a correction current divided by two to the nth power.

6. The circuit as recited in claim 3, wherein the supply voltage terminal is a first supply voltage terminal, the bandgap reference circuit including:
a second operational amplifier having inverting and non-inverting inputs and an output, in which the transistor is
a first P-type field effect transistor (PFET) having a gate and first and second terminals, the gate of the PFET coupled to the output of the second operational amplifier, the first terminal of the PFET coupled to a second voltage supply terminal, and the second terminal of the PFET coupled to the first terminal of the first resistor;
a seventh resistor coupled in series with a first bipolar transistor between the second terminal of the first transistor and the first supply voltage terminal, the inverting input of the second operational amplifier coupled to respective first terminals of the seventh resistor and the first bipolar transistor;
an eighth resistor and a ninth resistor coupled in series with a second bipolar transistor between the second terminal of the first transistor and the first supply voltage terminal, the non-inverting input coupled to respective first terminals of the eighth and ninth resistors;
a second current source coupled in series with a third bipolar transistor between the second supply voltage terminal and the first supply voltage terminal;

a first feedback resistor coupled between the inverting input of the second operational amplifier and a respective first terminal the current source; and a second feedback resistor coupled between the non-inverting input of the second operational amplifier and the first terminal of the current source.

7. The circuit as recited in claim 1, wherein the resistance of the first resistor is less that the resistance of the second resistor.

8. The circuit as recited in claim 7, wherein the resistance of the first resistor divided by the resistance of the second resistor is about 0.2.

9. The circuit as recited in claim 1, wherein the bandgap reference circuit and the correction circuit are included on an integrated circuit chip.

10. The circuit as recited in claim 9, wherein the integrated circuit chip is a stand-alone chip.

11. The circuit as recited in claim 9, wherein the integrated circuit chip is a system-on-chip.

12. A method of operating a precision reference circuit, the method comprising:
utilizing a digital-to-analog converter (DAC) to add or subtract a correction voltage to a bandgap reference voltage to produce a precision reference voltage, the correction voltage being a fraction of the bandgap reference voltage, in which utilizing the DAC includes:
coupling the DAC to selectively receive a first bias voltage at respective gates of a plurality of first bias N-type field effect transistors (NFETs);
coupling the DAC to receive a second bias voltage at respective gates of a plurality of second bias NFETs from an output of an operational amplifier;
coupling an input of the DAC to an intermediate node of a bandgap reference circuit, a transimpedance resistor being coupled between an output of the bandgap reference circuit and the intermediate node; and
setting an external digital value for the DAC on a per-chip basis; and
providing the precision reference voltage to a circuit.

13. The method as recited in claim 12, wherein setting the external digital value for the DAC includes:
setting a default external digital value; and
varying the default external value depending on a bandgap voltage provided by the bandgap reference circuit.

14. A method of operating a precision reference circuit, the method comprising:
utilizing a digital-to-analog converter (DAC) to add or subtract a correction voltage to a bandgap reference voltage to produce a precision reference voltage, the correction voltage being a fraction of the bandgap reference voltage, e in which utilizing the DAC includes:
coupling the DAC to selectively receive a first bias voltage at respective gates of a plurality of first bias P-type field effect transistors (PFETs);
coupling the DAC to receive a second bias voltage from an output of an operational amplifier at respective gates of a plurality of second bias PFETs;
coupling an output of the DAC to an intermediate node of a bandgap reference circuit, a transimpedance resistor being coupled between an output of the bandgap reference circuit and the intermediate node; and
setting an external digital value for the DAC on a per-chip basis; and
providing the precision reference voltage to a circuit.

15. A circuit comprising:
a bandgap reference circuit including: a transistor having a first terminal coupled to a supply voltage terminal and having an output terminal; and a first resistor having first and second terminals, the first terminal of the first resistor coupled to the output terminal, in which the bandgap reference circuit is configured to provide a reference voltage at the output terminal; and
a reference voltage correction circuit including:
a digital-to-analog converter (DAC) having an output coupled to the second terminal of the first resistor and having an input;
second and third resistors, each having first and second terminals, the first terminal of the second resistor coupled to the second terminal of the first resistor and to the output of the DAC, the second terminal of the second resistor coupled to the first terminal of the third resistor;
a DAC bias circuit coupled between the supply voltage terminal and the second terminal of the third resistor, the DAC bias circuit having first and second control inputs, the first control input coupled to the input of the DAC circuit and to an intermediary node of the DAC bias circuit;
a current source coupled between the output of the DAC and the second terminal of the third resistor, the current source having a control input; and
an operational amplifier having first and second inputs and an output, the second input coupled to the second terminal of the second resistor and to the first terminal of the third resistor, the first input coupled to an intermediary node of the current source, and the output of the operational amplifier coupled to the control input of the current source and to the second control input of the DAC bias circuit.

16. The circuit as recited in claim 15, wherein:
the current source includes a fourth resistor coupled in series with a first N-type field effect transistor (NFET), a second NFET, and a fifth resistor between the output of the DAC and the second terminal of the third resistor; and
the DAC bias circuit includes a sixth resistor coupled in series with a first P-type field effect transistor (PFET), a second PFET, a third NFET, a fourth NFET, and a seventh resistor between the supply voltage terminal and the second terminal of the third resistor, in which a gate of the first PFET is coupled to the input of the DAC and to respective terminals of the second PFET and a third NFET, respective gates of the first and third NFETs are coupled together, and respective gates of the second and fourth NFETs are coupled to the output of the operational amplifier.

17. The circuit as recited in claim 16, wherein the supply voltage terminal is a first supply voltage terminal, and the DAC includes DAC elements, each DAC element including:
first and second switches; and
an eighth resistor coupled in series with a third PFET and a fourth PFET between the second supply voltage terminal and the second terminal of the first resistor, in which a gate of the third PFET is coupled to the first switch to receive a first bias voltage and a gate of the fourth PFET is coupled to the second switch, with the second switch coupled to the input of the DAC.

18. The circuit as recited in claim 17, wherein the first switch and the second switch of a respective DAC element are controlled by a respective bit of an externally provided digital value.

19. The circuit as recited in claim 18, wherein for an nth DAC element, the third PFET, the fourth PFET and the eighth resistor are sized to pass a respective current that is equal to a correction current divided by two to the nth power.

20. The circuit as recited in claim 17, the bandgap reference circuit including:
- a second operational amplifier having inverting and non-inverting inputs and an output, in which the transistor is
- a fifth PFET having a gate and first and second terminals, the gate of the fifth PFET coupled to the output of the second operational amplifier, the first terminal of the fifth PFET coupled to the second voltage supply terminal, and the second terminal of the fifth PFET coupled to the first terminal of the first resistor;
- a ninth resistor coupled in series with a first bipolar transistor between the second terminal of the first transistor and the first supply voltage terminal, the inverting input of the second operational amplifier coupled to respective first terminals of the ninth resistor and the first bipolar transistor;
- a tenth resistor and an eleventh resistor coupled in series with a second bipolar transistor between the second terminal of the first transistor and the first supply voltage terminal, the non-inverting input coupled to respective first terminals of the tenth and eleventh resistors;
- a second current source coupled in series with a third bipolar transistor between the second supply voltage terminal and the first supply voltage terminal;
- a first feedback resistor coupled between the inverting input of the second operational amplifier and a respective first terminal the current source; and
- a second feedback resistor coupled between the non-inverting input of the second operational amplifier and the first terminal of the current source.

\* \* \* \* \*